United States Patent
Boursier et al.

(10) Patent No.: US 9,558,110 B2
(45) Date of Patent: Jan. 31, 2017

(54) METHOD FOR MANAGING A FLASH MEMORY

(71) Applicants: CONTINENTAL AUTOMOTIVE FRANCE, Toulouse (FR); CONTINENTAL AUTOMOTIVE GMBH, Hannover (DE)

(72) Inventors: Nicolas Boursier, Saint-Jean (FR); Andreas Mehrwald, Regensburg (DE)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 95 days.

(21) Appl. No.: 14/436,510

(22) PCT Filed: Oct. 16, 2013

(86) PCT No.: PCT/EP2013/003107
§ 371 (c)(1),
(2) Date: Apr. 17, 2015

(87) PCT Pub. No.: WO2014/060096
PCT Pub. Date: Apr. 24, 2014

(65) Prior Publication Data
US 2015/0254176 A1 Sep. 10, 2015

(30) Foreign Application Priority Data
Oct. 19, 2012 (FR) ...................................... 12 59975

(51) Int. Cl.
*G06F 12/02* (2006.01)
*G06F 3/06* (2006.01)
(Continued)

(52) U.S. Cl.
CPC ........... *G06F 12/0246* (2013.01); *G06F 3/064* (2013.01); *G06F 3/0614* (2013.01); *G06F 3/0679* (2013.01);
(Continued)

(58) Field of Classification Search
CPC .... G06F 12/0246; G06F 3/0614; G06F 3/064; G06F 3/0679; G11C 16/349; G11C 29/82
See application file for complete search history.

(56) References Cited

U.S. PATENT DOCUMENTS

| | | |
|---|---|---|
| 5,832,493 A | 11/1998 | Marshall et al. |
| 2006/0013048 A1 | 1/2006 | Kim |

(Continued)

OTHER PUBLICATIONS

International Search Report, dated Nov. 26, 2013, from corresponding PCT application.

*Primary Examiner* — Eric S Cardwell
(74) *Attorney, Agent, or Firm* — Young & Thompson

(57) ABSTRACT

A method of managing a rewritable mass memory subdivided into sectors within which data pages are recorded, and data periodically updated, where data erasure in a sector erases all previously written data therein. The method includes:
  writing pieces of data in a sector, each piece being associated with a first block containing at least one information for identifying the data piece,
  writing information data in an administrative block for managing the data of the sector concerned in the sector, each block being written among other data of the sector and being associated with a second block including one information piece and one check information piece,
  a block including a first part giving general indications and a second part including a counter being incremented at each writing of an administrative block in a
(Continued)

new sector, each first block including a check number which is based on the corresponding administrative block counter.

13 Claims, 8 Drawing Sheets

(51) Int. Cl.
  *G11C 16/34* (2006.01)
  *G11C 29/00* (2006.01)
(52) U.S. Cl.
  CPC ............ *G11C 16/349* (2013.01); *G11C 29/82* (2013.01); *G06F 2212/7205* (2013.01); *G06F 2212/7206* (2013.01); *G06F 2212/7207* (2013.01); *G06F 2212/7209* (2013.01)

(56) References Cited

U.S. PATENT DOCUMENTS

| | | | |
|---|---|---|---|
| 2006/0156078 A1* | 7/2006 | Baumhof | G06F 3/0619 714/100 |
| 2006/0271729 A1 | 11/2006 | Oshima | |
| 2010/0191922 A1* | 7/2010 | Dickey | G06F 3/061 711/154 |

* cited by examiner

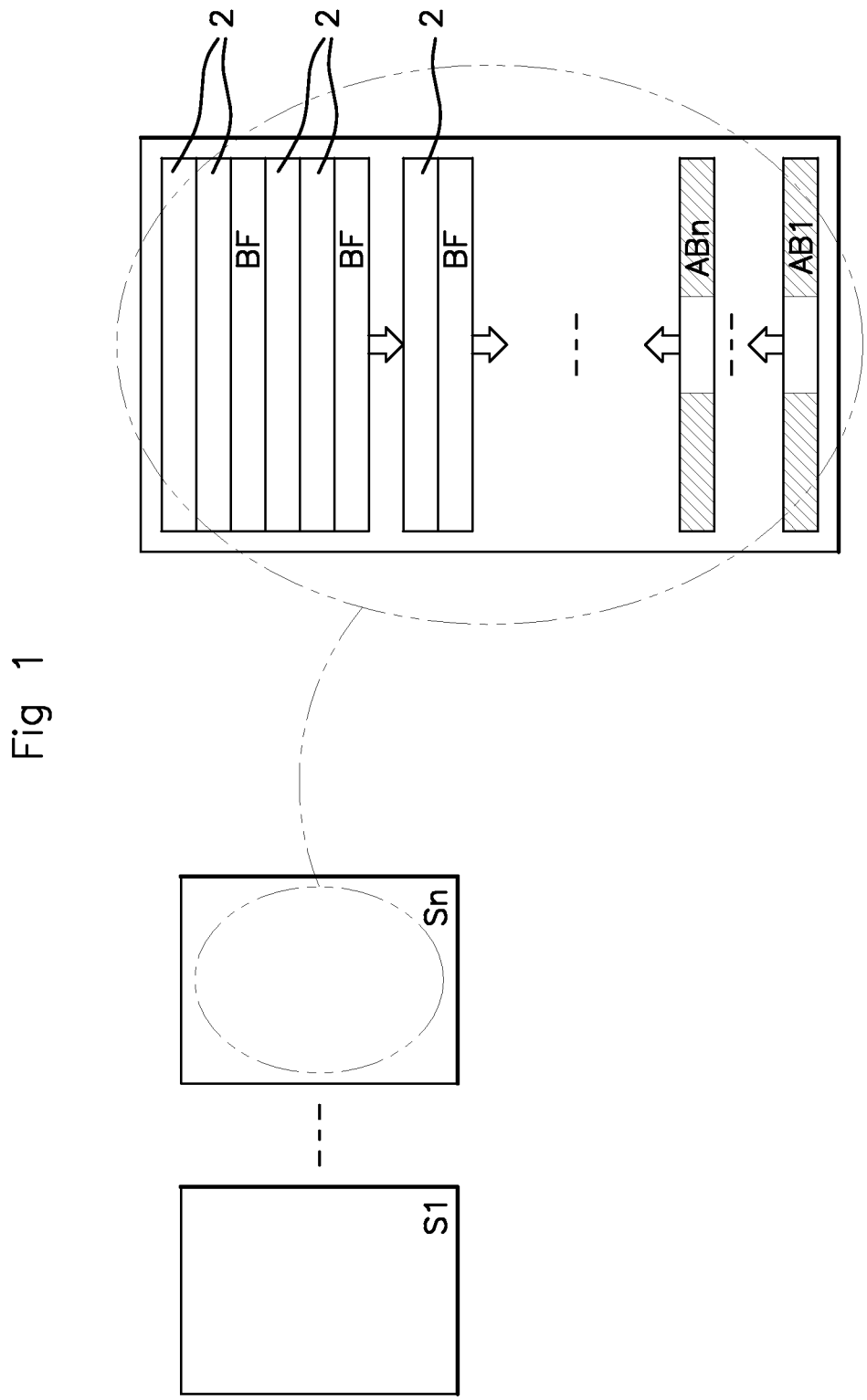

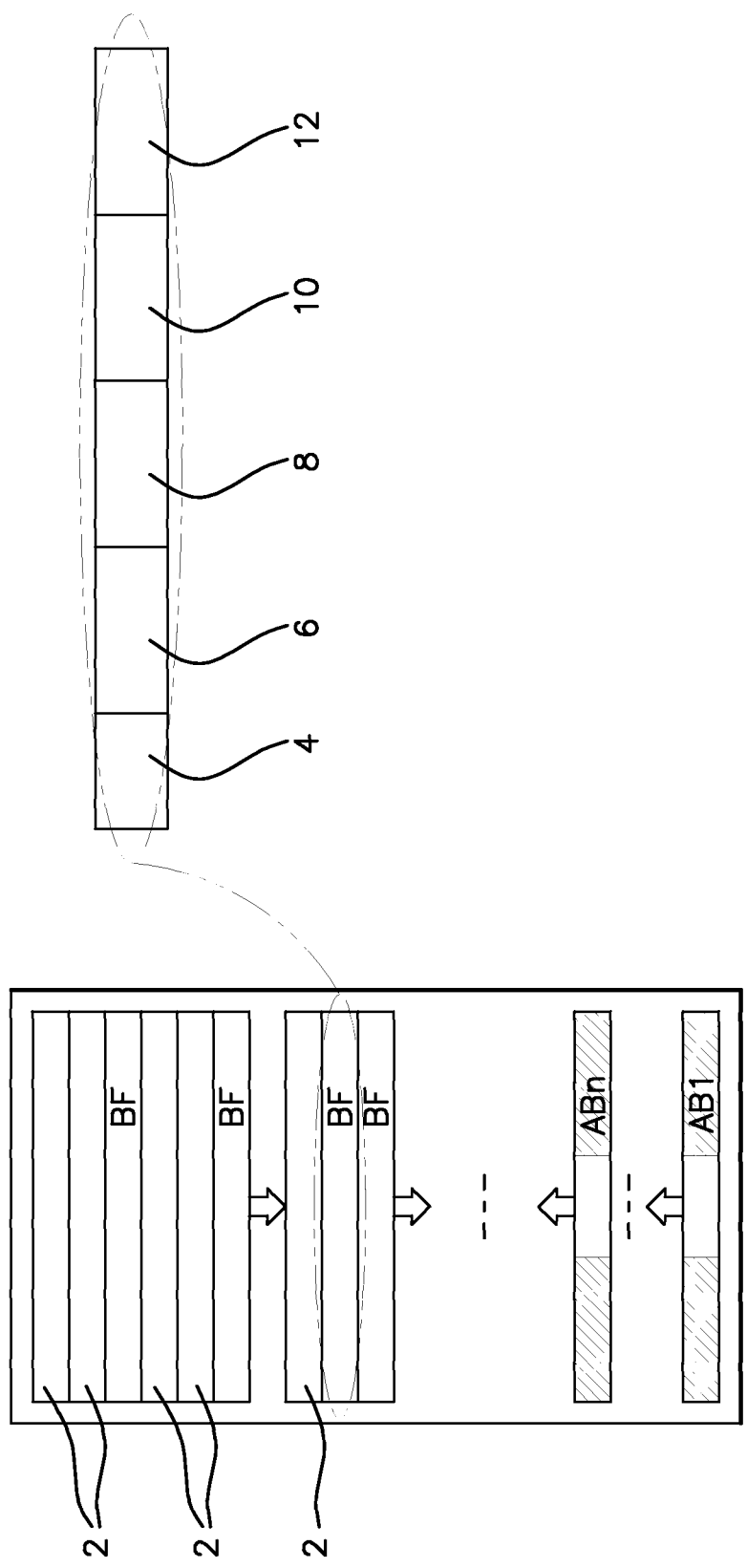

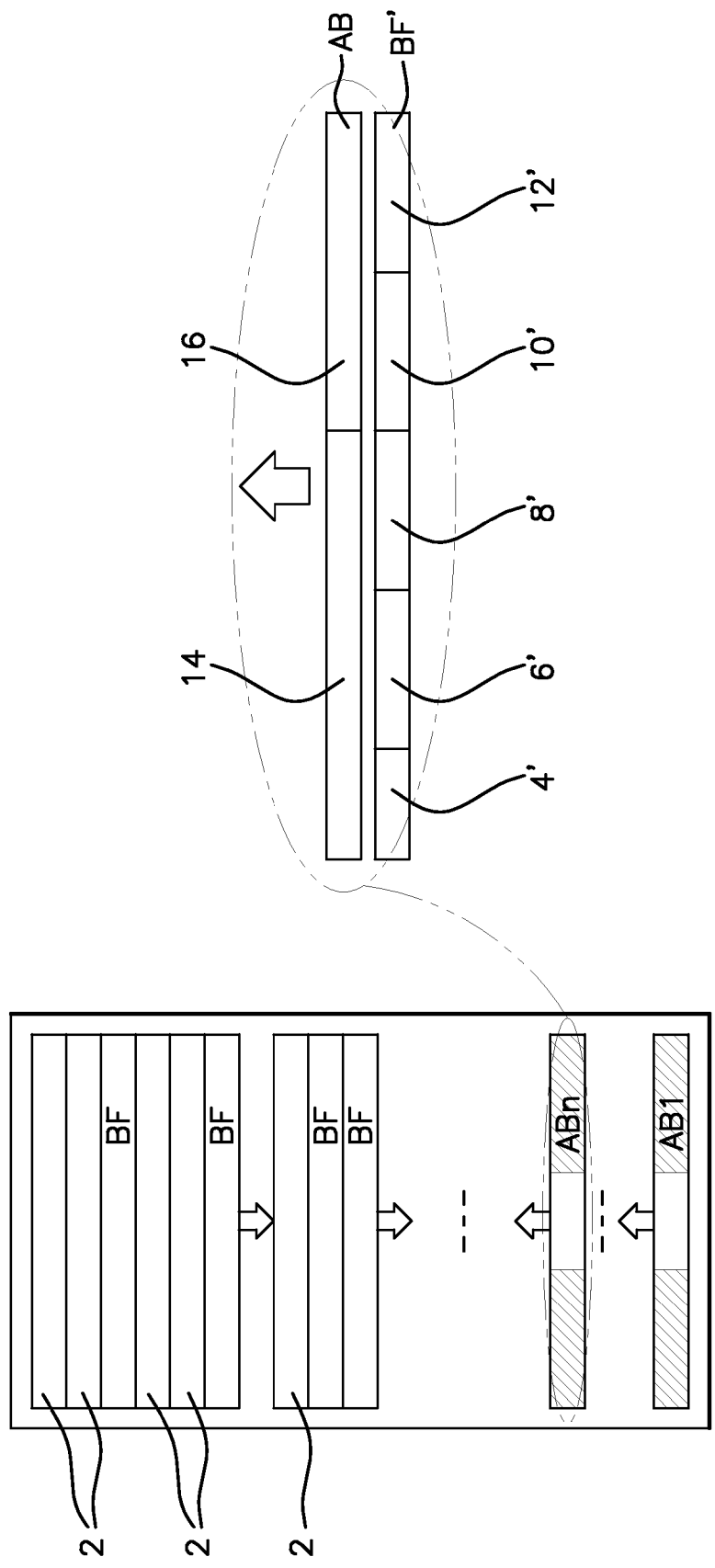

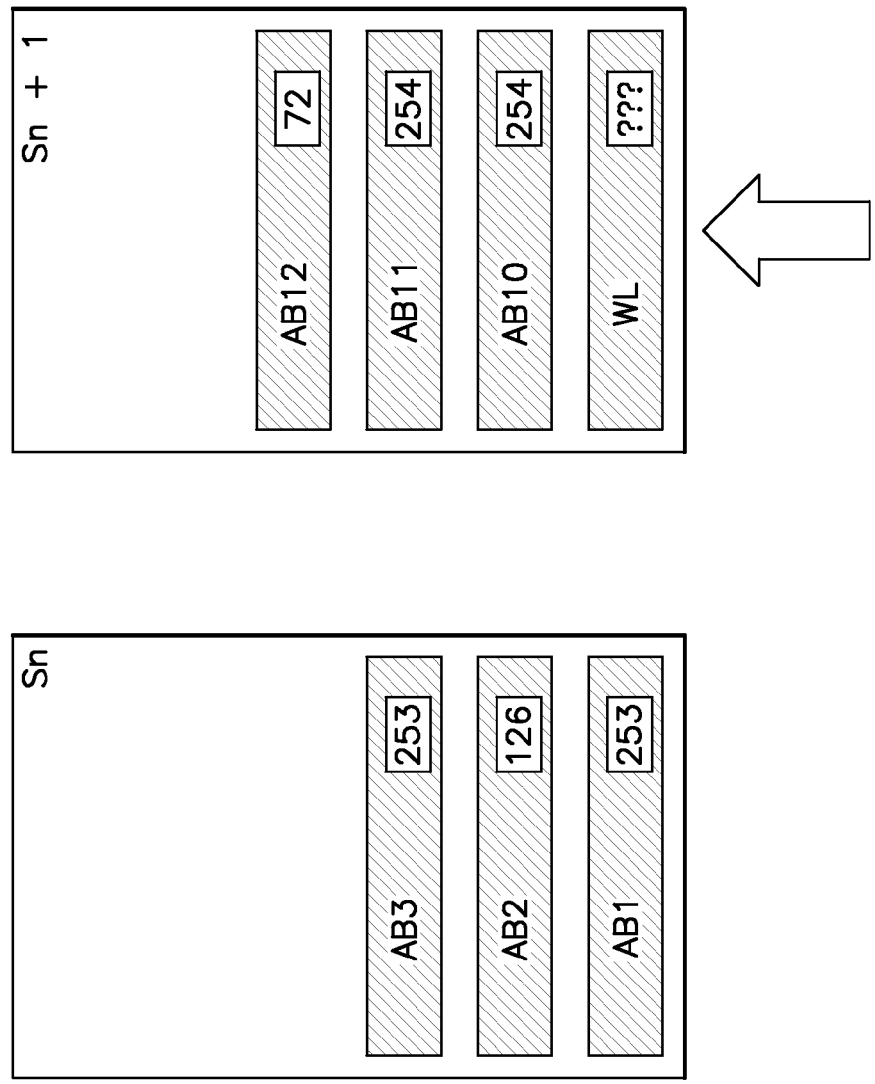

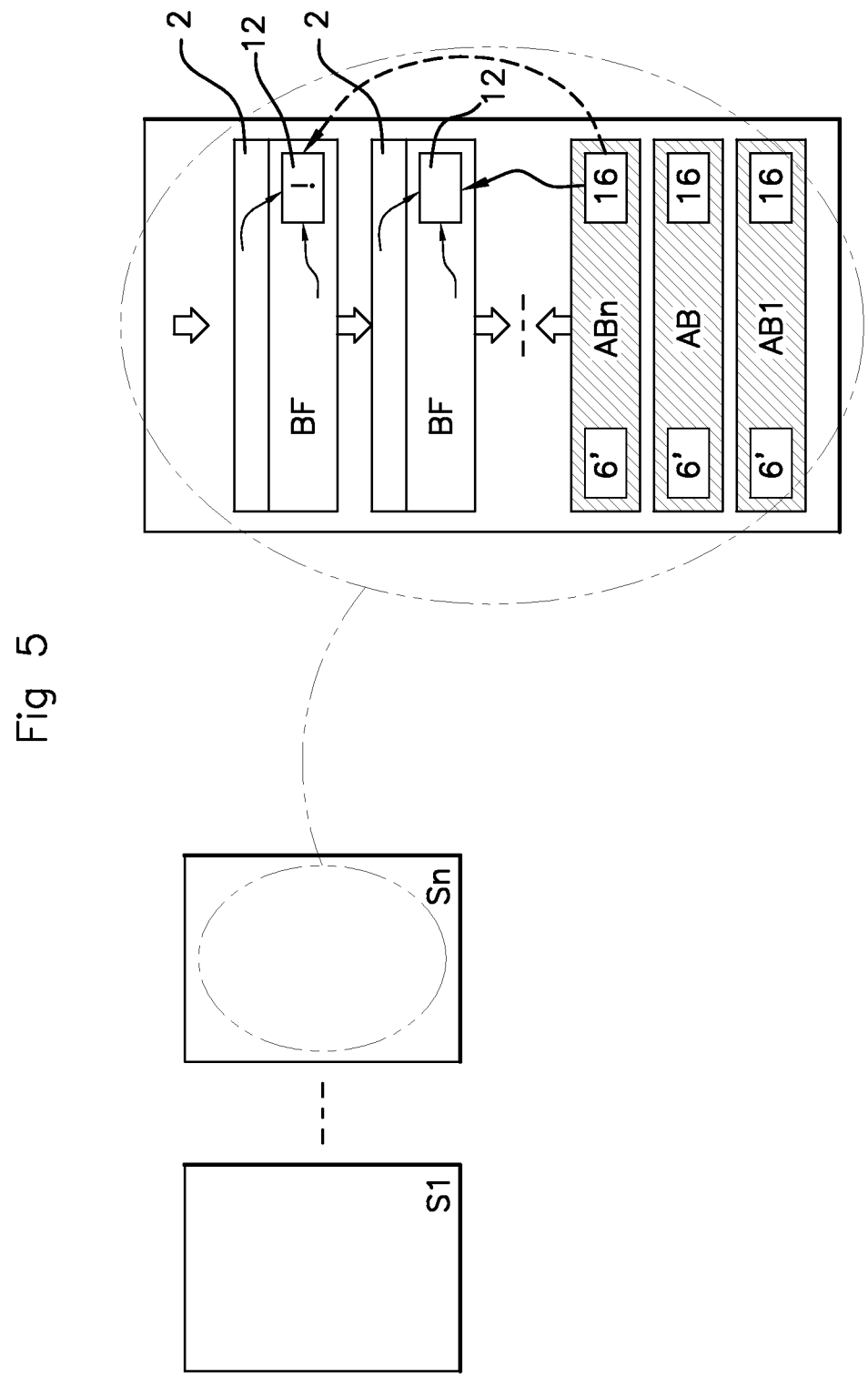

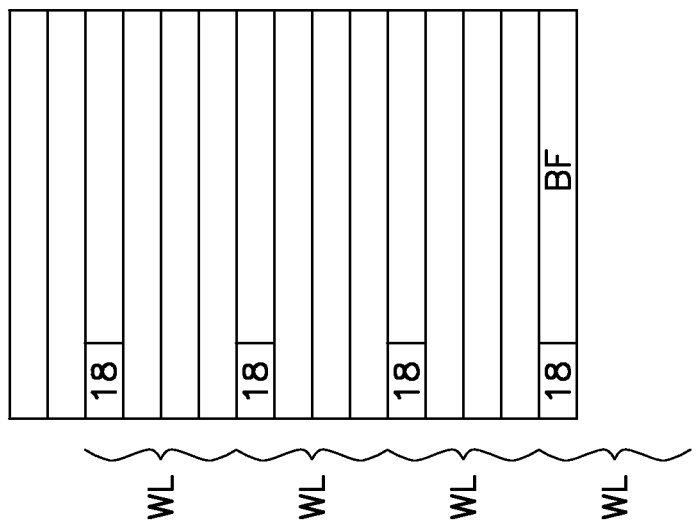

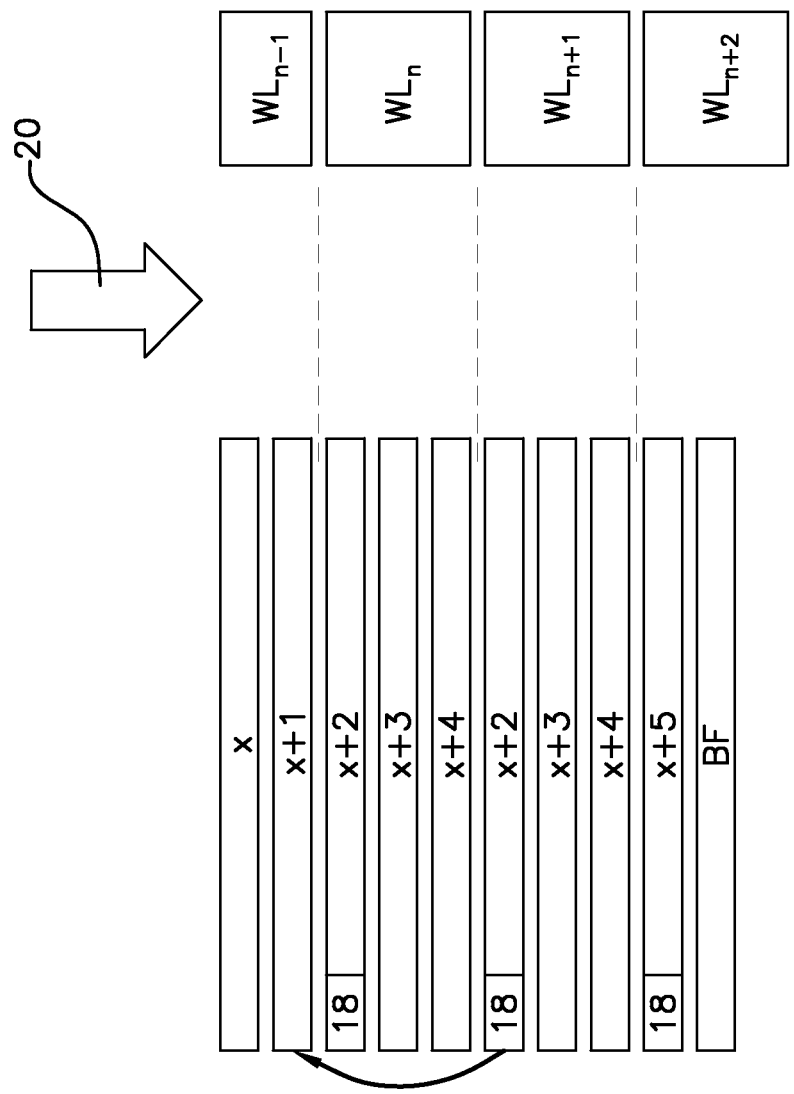

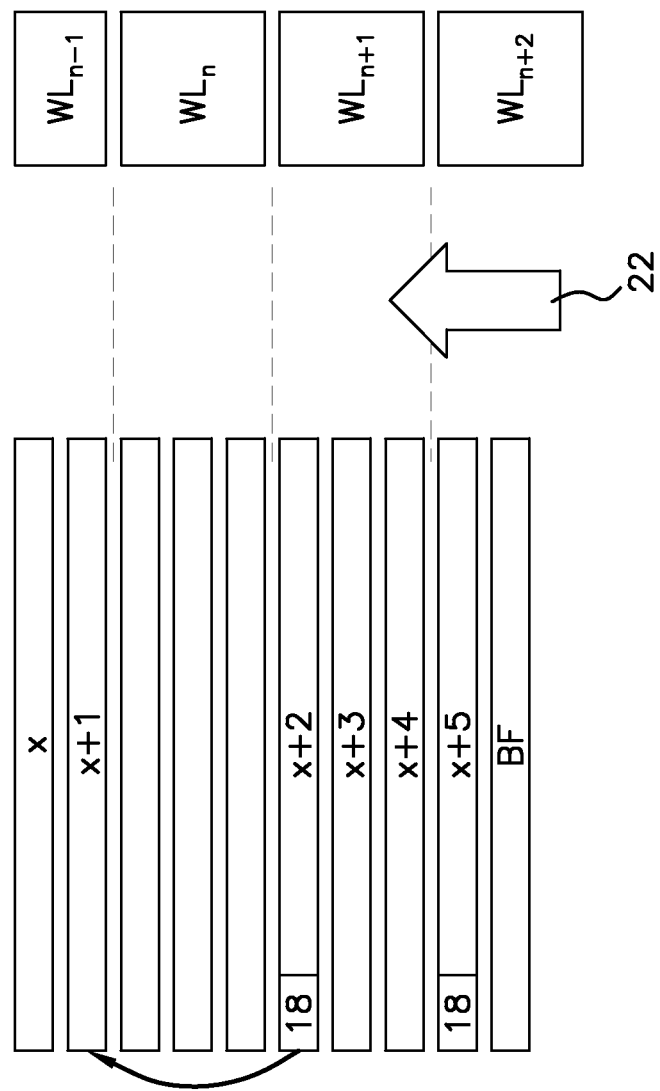

METHOD FOR MANAGING A FLASH MEMORY

The field of the present invention is that of memory management in a computer. There are several types of electronic memory that offer sometimes different operating modes. The present invention relates more particularly to a memory called flash memory. This is a rewritable semiconductor mass memory. Such a memory thus has the characteristics of a random access memory. However, it has the advantage that the stored data does not disappear when the memory is no longer electrically powered.

Flash memories are used, for example, in consumer devices, such as USB (Universal Serial Bus) keys. Because of their relatively low cost price, these flash memories are increasingly used in industry. They then replace, for example, EEPROM type memories commonly used in industrial computers.

The term EEPROM is an acronym for 'Electrically Erasable Programmable Read Only Memory'. Although this is a read only memory, an EEPROM memory can be erased and/or its contents can be modified a great number of times.

Flash memories and EEPROM memories are both easily erasable and rewritable. The electronic data is stored therein as a sequence of bits, i.e. basic information that can take two distinct discrete values, these two values being by convention 0 and 1.

The structure of an EEPROM memory is such that the size of the data that is individually modifiable, or granularity, is of the order of a few bytes (according to the suppliers), both in writing and erasure.

On the other hand, flash memories offer different writing and erasure granularities. They are segmented into sectors, which are themselves subdivided into pages. It is not possible, for example, to erase a piece of data unitarily but only an entire sector. On the other hand, the writing granularity is finer, for larger or smaller packets of bytes, represented electrically by what are called cells, according to the suppliers (e.g. 8 bytes or 128 bytes for two different types of flash memories). A page is an entity containing cells that are electrically dependent upon each other within the same page. The size of a page is at least equal to, but most often greater than the available writing granularity. This enables a large number of pieces of data to be written one after the other, by filling one page after another. However, when it is wanted to update small packets of data that change over time, it is not possible to erase an old piece of data with a current piece of data.

It is therefore not possible, without adaptation, to replace an EEPROM memory with a flash memory.

The present invention is aimed at enabling the use of a flash memory in a computer designed for operating with another type of memory and in particular an EEPROM memory. Indeed, the difference between a flash memory and an EEPROM memory may be taken directly into account when developing a new computer but, in an existing computer, e.g. during an upgrade, it may be useful, in particular for reasons of cost, to plan to use a flash memory.

A first object of the invention is therefore to provide a memory management method for using a flash memory with a computer designed for the use of an EEPROM memory, or another type of non-volatile memory that is writable a large number of times.

The method according to the present invention must provide high reliability when recording new data. It is indeed known, as mentioned above, that when a write error occurs in recording data in a flash memory, the write error does not just involve certain bits corresponding to one cell but in general a more or less large part of the corresponding sector. In the case of a disturbed or interrupted recording, it is possible therefore that groups of recording cells are affected. Different types of errors can occur. Thus, a part of a sector may remain blank after an erasure and no longer able to accept new recordings, comprise invalid random data, or retain values which are valid a priori but correspond to old data that has become unerasable, or all the bits may be written (all the bits equal 1).

The present invention therefore also has the object of adapting to the presence of parts of defective sectors within a flash memory.

For this purpose, the present invention provides a method of managing a rewritable mass memory subdivided into sectors within which data pages are recorded, in which data is periodically updated, the mass memory being such that the erasure of one piece of data in a sector involves the erasure of all the previously written data in this sector, said method comprising the following steps:
  writing pieces of data one after the other in a sector, each piece of data being associated with a first block containing at least one piece of information for identifying the piece of data,
  writing administrative information data in an administrative block for managing the data of the sector concerned in said sector.

According to the present invention,
  each administrative block of administrative information data is written among the other data of the sector and is associated with a second block comprising one piece of information for identifying the data and one piece of check information,
  an administrative block of administrative information data comprising a first part giving general indications and a second part including a counter being incremented at each writing of an administrative block of administrative information data in a new sector,
  each first block associated with data comprising a check number which is based, inter alia, on the corresponding administrative block of administrative information data counter.

In a method according to the present invention, the administrative data blocks are processed in the same way as the other data and therefore comprise a piece of check information in particular. The location of the administrative data of a sector is no longer a predetermined location as in previous flash memory management. Thus, if the area of the sector on which the administrative data is to be written is defective, this data can be written to another available place in the sector. Preferably the administrative data will be written following the data, after all the data has been written, but it is also conceivable to write it to another place and/or at another time.

The first part of the administrative block of administrative information data may, for example, contain a piece of information corresponding to a version of the software using the memory. The second block associated with the administrative block may contain an index for recognizing that it is associated with an administrative block and a check number on the recorded data, for example, a number determined by a cyclic redundancy check method.

Each first block associated with data comprising a check number which is based, inter alia, on the corresponding administrative block of administrative information data counter, can then be used to detect data which is apparently valid but which corresponds to a previous record. This feature is useful for detecting data in a data page that has become defective and non-erasable.

Advantageously, a second block associated with an administrative block has the same structure as a first block associated with data. There is then a simplified memory structure.

For detecting pages, the management method according to the present invention suggests that each data page, i.e. each data set occupying an area of the flash memory electrically independent of the other areas of said flash memory, should comprise, for example, at one end a piece of information that can be used on reading to determine a page that has to be read just after the page corresponding to said information. This information will preferably be written at the start of a page, i.e. just after the end of writing the previous page. In this case, but also for other embodiments of the present invention, the memory read direction and the memory write direction are advantageously inverted with respect to each other.

Finally, it is proposed that the administrative data block is written after all the data concerned by said block is written. In this way, the administrative data block is written only at the end of the process of writing the sector and validating the new written sector. If a problem arises during the writing of data, account may be taken thereof during the writing of the administrative data block.

For increasing the reliability of the management method according to the present invention, it may be provided that each administrative data block, and optionally any important piece of data, is written at least twice in areas of the flash memory electrically independent of each other.

The present invention also relates to a rewritable mass memory read-write device, characterized in that it comprises means suitable for the implementation of each of the steps of a method as described above as well as a computer comprising such a rewritable mass memory read-write device.

Details and advantages of the present invention will better emerge from the following description, with reference to the accompanying schematic drawing in which:

FIG. 1 illustrates a flash memory structure with the implementation of the present invention, FIG. 2 illustrates a block footer that can be used in the structure illustrated in FIG. 1, FIG. 3 illustrates an administrative block that can be used in a memory structure illustrated in FIG. 1, FIG. 4 illustrates the selection of an active sector using administrative blocks, FIG. 5 illustrates the detection of non-erasable data thanks to the implementation of the present invention, FIG. 6 illustrates a memory structure that can be used for the implementation of the present invention, FIG. 7 illustrates a recording with a method according to the present invention in a memory as illustrated in FIG. 6, and FIG. 8 illustrates a data reading from a memory illustrated in FIG. 6 and managed in accordance with the present invention.

FIG. 1 very schematically illustrates a flash memory. This memory comprises a plurality of sectors and FIG. 1 represents two of them schematically by a rectangle. FIG. 1 thus represents a sector called S1 and a sector called Sn which is also represented in this FIG. 1 on an enlarged scale.

In the enlarged detail of FIG. 1, first of all data pages 2 should be noted. Each time, below a group of data pages 2, there is a first block adopting the form in the example of a block footer BF. The group of data pages 2 may contain zero, one or more data pages 2. The structure of a block footer BF will be described in more detail in the following description.

Each sector of the flash memory also contains at least one administrative block AB which contains useful information for reading data located in this sector. FIG. 1 illustrates a first administrative block AB1 and a second administrative block ABn. In a novel way, these administrative blocks AB are not written to a predetermined place in the corresponding sector but may take a plurality of positions in this sector. However, since these administrative blocks are used for reading data in the sector, they will preferably be arranged at the foot of the sector when a sector is read from bottom to top. In this way, administrative blocks are read first when a sector is read.

It is assumed that in each sector, in a conventional way, the recorded information is organized in pages, each page comprising a predetermined number of bytes and a byte being formed of eight bits. A data page may comprise, for example, 128 or 256 bytes.

The alignment rules normally used for writing data to a sector of flash memory can be repeated here.

With regard to the administrative blocks AB, these are also preferably aligned and the start of each administrative block corresponds to the start of a data page. It may also be provided that each administrative block AB is redundantly recorded, in at least two electrically independent data pages.

Finally, preferably, administrative data blocks AB are recorded in a new sector after the data has been successfully written in this sector. Thus, the corresponding sector is declared as being a new active sector. As mentioned in the preamble to the present application, it is recalled that it is not possible to modify just one piece of data in a flash memory as it would then be necessary to entirely rewrite the sector containing the piece of data concerned. Thus, the new pieces of data are written one after the other by identifying them so as to be able to recognize the last valid piece of data. When a sector is complete, writing is begun in a new sector. If this sector contains old data, it is first of all erased. Then the most recent valid data is copied from the sector that has just been filled by writing in the new sector. This operation is called sector switching.

FIG. 2 illustrates by way of non-restrictive example a possible structure for a block footer BF. A structure already known from the prior art may be used for creating a block header or footer.

FIG. 2 again shows a sector containing data pages 2, block footers BF and administrative blocks AB. A block footer BF is shown in more detail. This block footer BF comprises, for example, 8 bytes that have just been written immediately after the corresponding data with an 8-byte alignment.

This block footer BF begins with a first byte 4 that indicates the position of the data corresponding to this block footer. Indeed, in case of a page of defective data, the data corresponding to the block footer BF will not be directly adjacent to this block footer but will be offset by one or two (or more) pages. FIG. 6 illustrates a practical case of the use of such information given by one byte.

At the end of the block footer BF is a new check number 12 which cooperates with a word 6, e.g. over two bytes, arranged after the first byte 4. The word 6 is a complement of the check number 12 and helps to identify a block footer among the data. The check number 12 corresponds, for example, to the cyclic redundancy check (CRC) technique. This type of check is known to the person skilled in the art and is not further described here.

The block footer BF then contains an index 8 with a length of one byte. This index is followed by a number 10 which mentions, for example, the length of the data corresponding to this block footer.

While the check word 6 is used for quickly verifying whether the page concerned contains an associated block footer, the check number 12 is determined here, in a novel way, on the block footer, the data pages and also, in a novel way, on the corresponding sector counter but not on the first byte 4.

FIG. 3 illustrates the structure of an administrative block AB of the sector illustrated in FIG. 2. The administrative block depicted comprises a first part 14 and a second part 16. The first part 14 may contain a piece of information concerning the driver version used. The second part 16 of the administrative block is used as a sector counter. This counter is, for example, incremented by 1 at each successful sector switch.

A second block adopting the form in the example of a block footer BF' is associated with the administrative block AB and has the same structure as a block footer BF as previously described. Thus there is a first byte 4' followed by a word 6', an index 8', a number 10' and at the end a check number 12'.

It is proposed here not to use the first byte 4' and to leave this at the value 0.

The word 6' is a check word similar to the word 6 described above in relation to the block footer BF.

The index 8' in turn takes a predetermined value, e.g. 254, indicating that this is a block footer associated with an administrative block.

The word 10' will give the length (fixed) of an administrative block.

The first part 14 of the administrative block is used for verifying the validity of the administrative block. If the driver version contained in this first part 14 does not match the software version used by the computer, the corresponding administrative block is considered invalid.

The second part 16 of the administrative block is incremented before writing the administrative blocks of a new sector, after the successful sector switch.

FIG. 4 illustrates a first sector Sn and a second sector Sn+1. The first sector Sn contains administrative blocks AB1, AB2 and AB3. For each of these administrative blocks the value of the sector counter has been shown. Thus, for the administrative blocks AB1 and AB3, the corresponding sector counter shows the value 253 while this value is 126 for the sector counter of the administrative block AB2. It is assumed here that this administrative block AB2 is a defective, non-erasable block. The administrative block AB3 is the redundant block of the administrative block AB1.

The sector Sn+1 contains a data page WL that is defective and invalid. This data page WL is located right at the bottom of the sector Sn+1. This is the location occupied in the prior art by the administrative block of a flash memory sector. When this location is occupied by a defective page, the complete sector is unusable (in the prior art). The present invention enables this defective data page to be detected and the corresponding sector to be used. As can be seen in FIG. 4, the latter comprises three administrative blocks AB10, AB11 and AB12. The administrative blocks AB10 and AB11 contain as sector value the value 254 while the administrative block AB12, which is a defective block, contains the value 72 in the sector counter thereof. As mentioned earlier, the sector counter is incremented whenever an administrative block is written in a previously erased sector, i.e. when the sector is declared valid.

For determining from the various sectors of a flash memory which is the valid sector, i.e. the one containing the most recent data, it is necessary to find the administrative block with the highest value at the sector counter level. In the case shown in FIG. 4, the sector Sn+1 is the valid sector since it has the value 254 in the sector counter of administrative blocks AB10 and AB11. It should be noted that this sector is the valid sector of the flash memory although its data page located at the foot of the sector, i.e. where the administrative block of a sector is usually located, is defective.

FIG. 5 illustrates the detection of non-erasable old data in a sector of a flash memory. This figure shows sectors S1 and Sn of the flash memory considered. The sector Sn is shown in more detail. Two data pages 2 are shown therein with a corresponding block footer BF. The check number 12 is shown in each block footer BF. It should be noted that in the first block footer BF, the check number 12 is marked by a '!' to indicate a problem with this check number. Here this is an apparently valid piece of data from an old block footer located in a defective data page.

Three administrative blocks AB1, AB and ABn are also shown in the sector Sn. Each of these administrative blocks is associated with a block footer (shown here as being included in the administrative block to which it corresponds) comprising a word 6' used for performing a check at the level of the administrative block. The administrative block in turn comprises a second part 16 used as a sector counter. In the scenario considered, it was assumed that the administrative block AB was an old defective administrative block. Its check word 6' is valid but its sector counter 16 detects the defectiveness of this administration block. It is assumed here that the administrative block ABn presents the highest sector counter value. This value is used for determining the check numbers 12 of the block footers BF. As symbolized by arrows in FIG. 5, these check numbers 12 are based, firstly, on the data of the block and the indications of the corresponding block footer BF, and secondly, on the sector counter of the corresponding valid administrative block. Thus it is possible to determine that the first data page 2, whereof the check number 12 is marked with a '!', is defective. It was assumed here that the data was apparently valid data but was located in a defective page. Of course, other defects may also be detected (e.g. blank or absurd data, etc.). The method used here is useful since it can even be used to detect a non-erasable data page. The manner of calculating the check number 12 of a block footer can be used to detect such data.

FIG. 6 illustrates a structure put in place for detecting a defective page WL. It is recalled here that a page is the smallest area of a sector that can be written to the flash memory electrically independently of other similar areas. It is proposed here to allocate one byte 18 at the start of each page. In a particular embodiment, this first byte 18 could be the first byte 4 of a block footer. It would suffice here to write a block footer at the start of each page.

FIGS. 7 and 8 illustrate the use of such a structure (FIG. 6) during the writing and reading of a sector for taking account of defective pages.

FIG. 7 shows one part of a sector and a few pages thereof. Thus four pages are represented: WLn−1, WLn, WLn+1 and WLn+2. Among these various pages it was assumed that WLn was defective.

The arrow bearing the reference 20 indicates the direction of writing the data in the sector considered. Data x, x+1 is successfully written in page WLn−1. The data x+2, x+3 and x+4 is then to be written on page WLn. An error occurring in writing, it is found that the page is defective. The same data, x+2, x+3 and x+4, is then rewritten in page WLn+1.

However, before writing this data in this new page, byte 18 is written at the start of page WLn+1 with the information indicating that, on reading, page WLn should be skipped. Once page WLn+1 is written, the data continues to be written normally and the writing is finished by writing the corresponding block footer BF.

FIG. 8 illustrates the reading of the previously recorded data in the description (see FIG. 7). Reading is performed in the opposite direction to writing. In FIG. 8 an arrow 22 shows the direction of reading the data in the sector considered. During this reading, the data of the block footer BF is read first. The reader then knows how many pages must be read to have all the data. In the present case, the reader knows that it must read six pages. It begins by reading the data x+5. After this, it reads byte 18 of page WLn+2 that tells it to pass on to the next page. The reader therefore continues reading through the data of page WLn+1 and successively reads the data x+4 then x+3 and x+2. Finally it reads byte 18 of page WLn+1. This byte was written after finding a write error in page WLn. The information provided by this byte 18 tells the reader that it should not read the next page WLn but the one after, page WLn−1. Thus, the reader continues to read in page WLn−1 and finds therein the rest of the data sought.

The method proposed in the foregoing description enables a computer, in particular a computer designed for operating with an EEPROM type memory, to operate with a flash memory while taking into account certain errors that may appear in such a memory. This method can be used in particular to take into account pages that cannot be erased or reprogrammed.

The proposed method can be used, after a power failure, to retrieve all the previously written data. It also enables the detection of erroneous data and even seemingly valid but old data. The sectors of the flash memory used containing defective areas can still be used for writing and reading data.

The security of the proposed method may be improved by redundantly writing important data. Thus, for example, provision may be made for administrative blocks to be written twice. The information written a second time is written in a page that is not likely to be affected when a problem occurs in the page where the important data has been written a first time.

The use of 'floating' administrative blocks combined with other features can be used to achieve the aforementioned advantages.

The present invention is not limited to the preferred embodiment described above by way of a non-restrictive example. It also relates to all the variant embodiments within the scope of the person skilled in the art.

The invention claimed is:

1. A method of managing a rewritable mass memory subdivided into sectors (Sn) within which data pages (WL) are recorded, in which data is periodically updated, the mass memory being such that the erasure of one piece of data in a sector (Sn) involves the erasure of all the previously written data in this sector, said method comprising the following steps:
    writing pieces of data one after the other in a sector, each piece of data being associated with a first block (BF) containing at least one piece of information for identifying the piece of data,
    writing administrative information data in an administrative block (AB) for managing the data of the sector concerned in said sector,
    wherein
        each administrative block (AB) of administrative information data is written among the other data of the sector (Sn) and is associated with a second block (BF') comprising one piece of information for identifying the data and one piece of check information,
        an administrative block (AB) of administrative information data comprising a first part (14) giving general indications and a second part (16) including a counter being incremented at each writing of an administrative block (AB) of administrative information data in a new sector,
        each first block (BF) associated with data comprising a check number (12) which is based, inter alia, on the corresponding administrative block (AB) of administrative information data counter.

2. The management method as claimed in claim 1, wherein a second block (BF') has the same structure as a first block (BF) associated with the data.

3. The management method as claimed in claim 2, wherein each data page, i.e. each data set occupying an area of the flash memory electrically independent of the other areas of said flash memory, comprises at one end a piece of information (18) that can be used on reading to determine a page that has to be read just after the page corresponding to said information.

4. The management method as claimed in claim 2, wherein the memory read direction and the memory write direction are inverted with respect to each other.

5. The management method as claimed in claim 2, wherein each administrative block (AB) of administrative data is written at least twice in areas of the flash memory electrically independent of each other.

6. The management method as claimed in claim 1, wherein each data page, i.e. each data set occupying an area of the flash memory electrically independent of the other areas of said flash memory, comprises at one end a piece of information (18) that can be used on reading to determine a page that has to be read just after the page corresponding to said information.

7. The management method as claimed in claim 6, wherein the memory read direction and the memory write direction are inverted with respect to each other.

8. The management method as claimed in claim 6, wherein each administrative block (AB) of administrative data is written at least twice in areas of the flash memory electrically independent of each other.

9. The management method as claimed in claim 1, wherein the memory read direction and the memory write direction are inverted with respect to each other.

10. The management method as claimed in claim 9, wherein each administrative block (AB) of administrative data is written at least twice in areas of the flash memory electrically independent of each other.

11. The management method as claimed in claim 1, wherein each administrative block (AB) of administrative data is written at least twice in areas of the flash memory electrically independent of each other.

12. A rewritable mass memory read-write device, which comprises means suitable for the implementation of each of the steps of a method as claimed in claim 1.

13. A computer, which comprises a rewritable mass memory read-write device as claimed in claim 12.

* * * * *